United States Patent
Nakano

(10) Patent No.: US 8,378,505 B2
(45) Date of Patent: Feb. 19, 2013

(54) SEMICONDUCTOR SUBSTRATE STRUCTURE AND SEMICONDUCTOR DEVICE

(75) Inventor: Sumiaki Nakano, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/189,097

(22) Filed: Jul. 22, 2011

(65) Prior Publication Data

US 2011/0278720 A1     Nov. 17, 2011

Related U.S. Application Data

(63) Continuation of application No. PCT/JP2009/003722, filed on Aug. 4, 2009.

(30) Foreign Application Priority Data

Feb. 4, 2009 (JP) .................... 2009-023425

(51) Int. Cl.
*H01L 23/492* (2006.01)
(52) U.S. Cl. ....... 257/781; 257/737; 257/779; 257/780; 257/E23.021; 438/612
(58) Field of Classification Search .............. 257/737, 257/779–781, E23.02, E23.021; 438/612
See application file for complete search history.

(56) References Cited

U.S. PATENT DOCUMENTS

| | | | | |
|---|---|---|---|---|
| 4,472,730 A * | 9/1984 | Ohta | | 257/786 |
| 6,400,036 B1 * | 6/2002 | Tang et al. | | 257/780 |
| 6,787,923 B2 * | 9/2004 | Tan et al. | | 257/779 |
| 7,358,174 B2 * | 4/2008 | Mis | | 438/612 |
| 2002/0090805 A1 * | 7/2002 | Yap et al. | | 438/615 |
| 2003/0034550 A1 | 2/2003 | Nakatani | | |
| 2003/0127747 A1 * | 7/2003 | Kajiwara et al. | | 257/778 |
| 2005/0006759 A1 * | 1/2005 | Huang | | 257/734 |
| 2005/0046025 A1 * | 3/2005 | Kanda | | 257/735 |
| 2005/0070083 A1 * | 3/2005 | Johnson et al. | | 438/612 |
| 2006/0286791 A1 * | 12/2006 | Feng | | 438/613 |

FOREIGN PATENT DOCUMENTS

| | | |
|---|---|---|
| EP | 1544916 A1 | 6/2005 |
| JP | 56-019639 A | 2/1981 |
| JP | 57126132 A * | 8/1982 |
| JP | 02-087629 | 3/1990 |
| JP | 04-355933 | 12/1992 |
| JP | 2000-332151 | 11/2000 |
| JP | 2001-053111 | 2/2001 |
| JP | 2005-183992 | 7/2005 |
| JP | 2005-353980 A | 12/2005 |
| JP | 2008-177456 | 7/2008 |
| JP | 2008-198670 | 8/2008 |
| KR | 10-2005-0061783 | 6/2005 |

\* cited by examiner

*Primary Examiner* — Allan R Wilson
(74) *Attorney, Agent, or Firm* — McDermott Will & Emery LLP

(57) ABSTRACT

A semiconductor substrate structure includes an electrode pad formed on a semiconductor substrate, a protective film formed on the semiconductor substrate with a distance from the electrode pad, and a bump formed on the electrode pad. The protective film has a barrier portion surrounding the electrode pad. The barrier portion has a height different from a height of a part of the protective film other than the barrier portion.

9 Claims, 5 Drawing Sheets

(a)

(b)

(a)

(b)

(c)

(a)

(b)

(c)

SEMICONDUCTOR SUBSTRATE STRUCTURE AND SEMICONDUCTOR DEVICE

CROSS-REFERENCE TO RELATED APPLICATION

This is a continuation of PCT International Application PCT/JP2009/003722 filed on Aug. 4, 2009, which claims priority to Japanese Patent Application No. 2009-023425 filed on Feb. 4, 2009. The disclosures of these applications including the specifications, the drawings, and the claims are hereby incorporated by reference in their entirety.

BACKGROUND

The present disclosure relates to semiconductor substrate structures having bumps and semiconductor devices having bumps.

In a technical field of packaging semiconductor devices, bump electrodes have been formed for chip-size packages, chip-scale packages, flip-chips, and the like. The bump electrodes have bumps such as electrode pads, metal balls, and the like. In the surroundings of the bump electrode, a passivation film, a protective film for protecting a top surface, and the like are generally formed. For formation of the bump electrodes, a printing method, a plating method, a bump material mounting method, and the like have been used.

In the printing method, after a printing mask is positioned, a printing paste including a bump material paste and a flux is supplied on a wafer through the printing mask. Then, bumps are formed by performing a reflow process. In processing fine patterns, the printing method has a problem of causing variation of diameters of bumps formed after the reflow process since the printing paste is less likely to be released from the printing mask in processing fine patterns.

In the plating method, bumps are formed on an electrode pad by electrolytic plating or electroless plating. When the plating method is processed, it is necessary to control a current used for plating depending on the number of electrodes, thereby making the current control complicated. Therefore, the method has a problem with the shape precision of the bumps.

The bump material mounting method has been used for ball grid arrays (BGAs) and the like, and it is a method of, after gripping bump materials onto a suction head, mounting (transferring) the gripped bump materials all at once on an electrode pad. In the bump material mounting method, when each of the bump materials is small, it becomes difficult to grip the bump materials all at once onto the head. Thus, such a one-time transfer is said to have an upper limit of several thousands of materials. As a method to increase the scale of the one-time transfer, a method by using a mask for mounting has been considered (for example, see Japanese Patent Publication No. 2000-332151). This is a method of mounting bump materials which are to be used for forming bumps all at once on an electrode pad through a mask for mounting that has an opening whose diameter is equal to or larger than that of the bump material. The method, by using a mask having approximately the same thickness as the bump material, and having an opening into which the bump material drops, supplies and disposes the bump materials which are to be used for forming the bumps. Therefore, it is possible to precisely and efficiently supply and dispose the bump materials in necessary positions.

SUMMARY

However, in the case of a bump material mounting method using a mask for mounting, it is necessary to have steps of forming a mask for mounting which has approximately the same thickness as a bump material and removing the mask. It is also necessary to, before the bump material is supplied, perform a flux printing process on an electrode pad by using a printing mask. In the flux printing process, flux may be printed in a state where the flux is excessively spread due to factors, such as a printing device, a printing condition and the like, or material properties of the flux. When a bump material is mounted or a reflow process is performed with the flux excessively spread, an adjacent bump material moves to be in contact with the bump material, thereby causing defects. Conventionally, any problems occurring in a flux printing process have not been recognized, and no countermeasures have been taken.

It is an object of the present invention to solve problems occurring in a flux printing process, and to achieve a semiconductor device which reduces occurrence of bump electrodes having defects.

In order to attain the above object, the present invention is configured such that a semiconductor substrate structure has a protective film in which a barrier portion for surrounding an electrode pad is formed.

Specifically, a semiconductor substrate structure according to the present invention includes: an electrode pad formed on a semiconductor substrate; a protective film formed on the semiconductor substrate and having an opening through which the electrode pad is exposed; and a bump formed on the electrode pad, wherein the electrode pad and the protective film are formed with a distance from each other, the protective film has a barrier portion surrounding the electrode pad, and the barrier portion has a height different from a height of a part of the protective film other than the barrier portion.

The semiconductor substrate structure of the present invention includes the protective film having a barrier portion surrounding the electrode pad. Therefore, when flux is printed on the electrode pad, the flux is widely spread over the protective film, thereby preventing the flux from contacting flux on an adjoining electrode pad. Accordingly, when the bumps are formed, it is possible to reduce bump formation defects, such as formation of dislocated bumps misaligned with the electrode pads due to deviation along the flux, connected adjoining bumps resulting in an enlarged bump, and short-circuited adjoining bumps due to contact between them.

In the semiconductor substrate structure of the present invention, the barrier portion may be a recessed portion. In this case, at least a part of the recessed portion may have an affinity for flux higher than an affinity for the flux in the other parts of the protective film. The electrode pad may have an electrode pad body and an under barrier metal layer formed on the electrode pad body, and the bottom surface of the recessed portion is located in a position equal to or higher than the upper surface of the electrode pad body.

In the semiconductor substrate structure of the present invention, the barrier portion may be a raised portion. In this case, at least a part of the recessed portion may have an affinity for flux lower than an affinity for the flux in the other parts of the protective film.

In the semiconductor substrate structure of the present invention, the barrier portion may continuously surround the electrode pad.

In the semiconductor substrate structure of the present invention, the protective film may be made of a polyimide resin, a polybenzoxazole resin, or a silicone-based resin.

A semiconductor device according to the present invention includes the semiconductor substrate structure of claim 1.

According to the semiconductor substrate structure of the present invention, problems occurring in the flux printing process can be solved, and a semiconductor device which reduces occurrence of bump electrodes having defects can be achieved.

BRIEF DESCRIPTION OF THE DRAWINGS

FIG. 1A is a plan view, and FIG. 1B is a cross-sectional view taken along line Ib-Ib in FIG. 1A.

DETAILED DESCRIPTION

Figure 1:
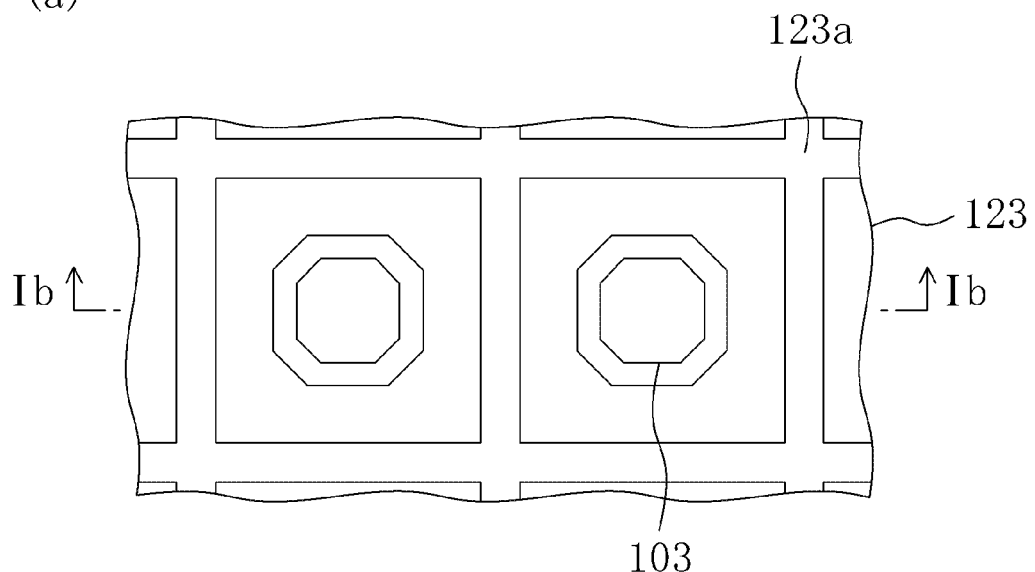
FIGS. 1A and 1B show a semiconductor substrate structure according to one embodiment of the present invention.
Figure 1:
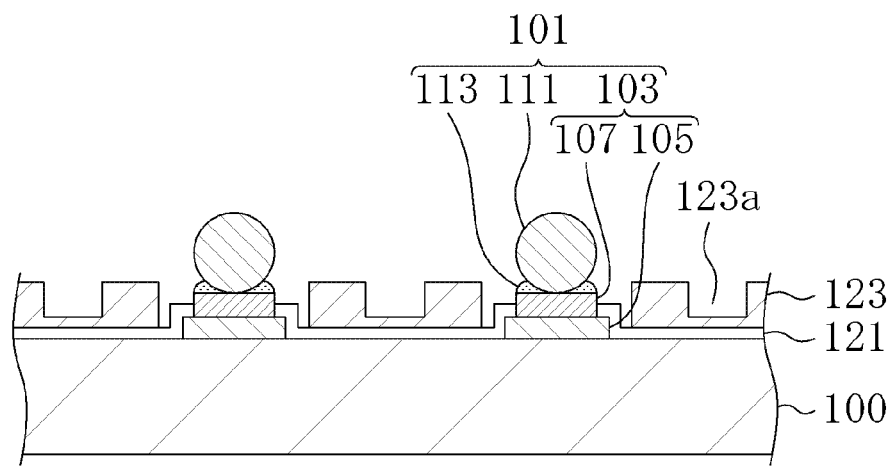

One embodiment of the present invention will be described with reference to the accompanying drawings. FIGS. 1A and 1B show a semiconductor substrate structure according to the embodiment, and FIG. 1A shows a plan structure thereof, and FIG. 1B shows a cross-sectional structure thereof. In FIG. 1A, the illustration of bumps 111 is omitted. The semiconductor substrate structure in the embodiment has bump electrodes 101 formed on a semiconductor substrate 100 including a semiconductor element (not shown) and the like. The bump electrode 101 includes an electrode pad 103 and a bump 111. The electrode pad 103 includes an electrode pad body 105 made of aluminum (Al), etc., and an under barrier metal (UBM) layer 107 formed on the electrode pad body 105. On the UBM layer 107, a flux layer 113 is formed, and a bump 111 is fixed. On the semiconductor substrate 100, a passivation film 121 made of a nitride film ($Si_3N_4$) is formed so as to expose the upper surface of the electrode pad 103. On the passivation film 121, a protective film 123 having an opening through which the electrode pad 103 is exposed is formed. The protective film 123 and the electrode pad 103 are formed with a distance from each other. The protective film 123 has a barrier portion 123a surrounding the electrode pad 103. In FIG. 1, the barrier portion 123a is a recessed portion having a height lower than a height of the other parts of the protective film 123.

When a semiconductor substrate structure is formed, the following steps, for example, may be performed. First, the semiconductor substrate 100 in which a semiconductor element and the like are formed is prepared, and the electrode pad body 105 made of Al, etc. and connected to the semiconductor element and the like is formed on the substrate. Subsequently, the passivation film 121 made of $Si_3N_4$, etc. is formed on the semiconductor substrate 100. Then, the passivation film 121 is removed by etching to form an opening through which the electrode pad body 105 is exposed. Next, the UBM layer 107 is formed on a portion of the electrode pad body 105 exposed from the opening. Subsequently, a protective film 123 having a barrier portion 123a is formed with a distance from the electrode pad body 105.

The UBM layer 107 may be formed as follows, for example. First, after a soft etch process is performed with respect to the surface of the electrode pad body 105 to remove an oxide film, the surface of the electrode pad body 105 is immersed into a zincate treatment solution to precipitate zinc particles. Subsequently, the surface of the electrode pad body 105 is immersed into an electroless nickel (Ni) plating solution to form a Ni film having a thickness of approximately $5 \times 10^{-3}$ mm on the electrode pad body 105. In some cases, the surface of the electrode pad body 105 may be further immersed into an electroless Au plating solution to form a flash Au plating layer having a thickness of approximately $5 \times 10^{-5}$ mm on the Ni film. The protective film 123 may be formed as follows. Polyimide and the like are uniformly coated on the semiconductor substrate 100 by using a spinner. Subsequently, after a pre-bake is carried out (70° C.×50 seconds, 90° C.×50 seconds, and 105° C.×110 seconds), an exposure is performed with a pattern in which openings each having a size similar to the electrode pad 103 are formed. Next, after a pre-development bake (80° C.×50 seconds) is carried out, a development process and a cure process (140° C.×170 seconds, and 350° C.×3600 seconds) are sequentially carried out. The protective film may be formed by using polyimide, polybenzoxazole, and a silicone-based resin material or the like.

In the semiconductor substrate structure in the embodiment, the protective film 123 is formed with a distance from the electrode pad 103. The protective film 123 has the barrier portion 123a surrounding the electrode pad 103. Therefore, when flux is printed on the electrode pad 103 to form the flux layer 113, the flux is limited to flow over in a lateral direction, thereby making it possible to reduce the wide spread of the flux.

The flux layer 113 is generally formed by the following method. First, a printing mask which is a thin metal plate having a thickness of approximately 0.02 mm to 0.04 mm so as to be capable of covering the whole surface of the semiconductor substrate 100, and which has an opening so as to match the coordinate of the electrode pad 103 is prepared. Subsequently, flux is printed on the electrode pad 103 by using a rubber squeegee or a metal squeegee. In the bump material mounting method, flux having a viscosity of from 100 Pa·s to 200 Pa·s is generally used. However, flux having a lower viscosity of from 10 Pa·s to 50 Pa·s may be used in some cases. In this case, the shape of the flux after printing is likely to be deformed, and to be spread in a lateral direction. The extent of the spread of the flux varies depending on a squeegee speed during the printing. For example, when electrode pads each having a diameter of 120 μm are aligned with pitches of 180 μm, if a rosin-based flux having a relatively high viscosity of 180 Pa·s is used, it is possible to properly print the flux on each of the UBM layers 107 at a squeegee speed of 100 mm/s. However, if the squeegee speed is 1 mm/s, the flux is widely spread. Therefore, when the barrier portion 123a is not formed, flux is spread over a region between adjoining ones of the electrode pads 103, and adjoining ones of the flux layers 113 come into contact with each other.

If the flux layers 113 come into contact with each other between the adjoining ones of the electrode pads 103, incomplete formation of the bumps 111 occurs. The incomplete formation of the bumps 111 will occur for the following reasons. First, the formation of the bump 111 will be shown. By using a mask for mounting in which an opening is provided in the coordinate position of the electrode pad, a bump material which is to be a material of the bump 111 and which has a spherical shape or a shape similar to a spherical shape is aligned on the UBM layer 107 on which the flux layer 113 is printed. A solder material having, for example, a Sn—Ag—Cu composition may be used as the bump material. The bump material may have a diameter of 0.07 mm to 0.125 mm (in the case where the bump material does not have a spherical shape, an average value of widths in the longitudinal direction and the lateral direction). After the bump materials are supplied, when a heat treatment of the semiconductor substrate 100 is performed, the bump material is melted to join with the UBM layer 107.

In this case, if the flux layer 113 is printed in a portion in addition to the electrode pad 103, the bump material is likely to move to a position except the electrode pad 103 during a reflow process. For instance, if the bump material is moved from a position which is on the electrode pad 103, the bump 111 is formed in a position shifted from a position which is directly on the electrode pad 103. If the bump material which has moved comes into contact with an adjoining bump material, an enlarged bump is formed, and a defect called a bridge connecting two of the electrode pads 103 occurs. The bump material which has moved is more likely to come into contact with an adjoining bump material, resulting in a defective bump. The move of the bump material occurs due to vibration of a conveyer in a reflow furnace, circulating air in a reflow furnace, stress of flux coated in advance which occurs when the flux is softened, etc.

In order to reduce the incomplete formation of the bumps 111 as stated above, the protective film 123 is formed with a distance from the electrode pad 103 in the embodiment. By physically separating the electrode pad 103 and the protective film 123 from each other, excess flux which may be spread over the protective film 123 can be captured in a recess between the electrode pad 103 and the protective film 123. Furthermore, since the protective film 123 has the barrier portion 123a which is a recessed portion surrounding the electrode pad 103, the flux having spread over the protective film 123 is trapped by the barrier portion 123a. Therefore, the flux is not spread beyond a limited scope, and in a reflow process after the bump materials are mounted, the bump material can be prevented from moving to come into contact with an adjacent bump material.

Figure 2:
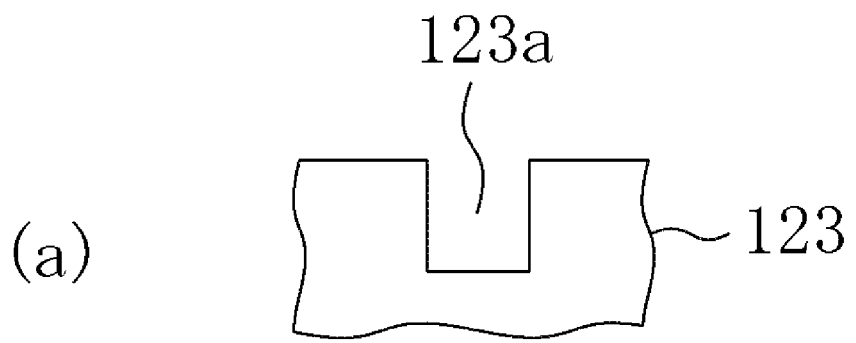
FIGS. 2A-2C are cross-sectional views showing shapes of recessed portions in the semiconductor substrate structure according to the embodiment of the present invention.
Figure 2:
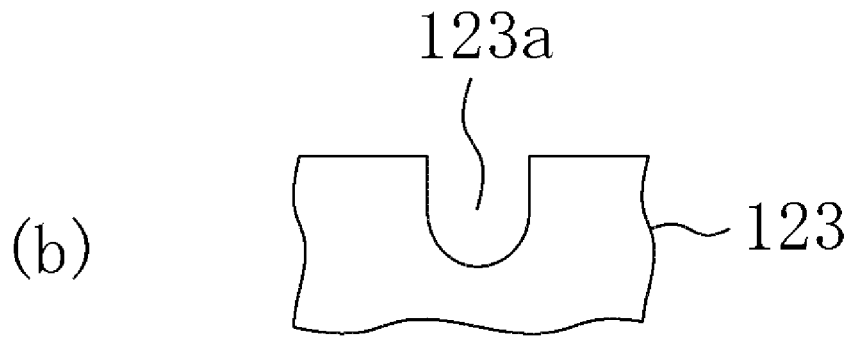
Figure 2:
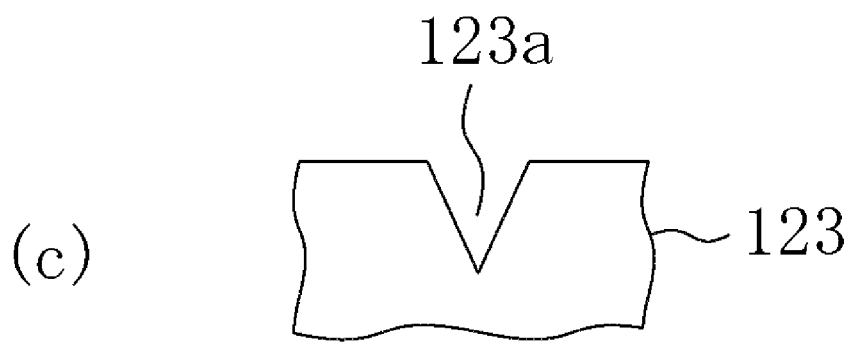

It is preferable that the height of the bottom surface the barrier portion 123a is equal to or higher than the height of the upper surface of the electrode pad body 105. With this structure, flux can be induced to the side of the electrode pad 103. The barrier portion 123a which is the recessed portion may have a flat bottom surface as shown in FIG. 2A, may have a U-shaped cross section as shown in FIG. 2B, or may have a V-shaped cross section as shown in FIG. 2C. Any shape other than these shapes may be used.

When the barrier portion 123a is the recessed portion, it is preferable that at least a part of the recessed portion has an affinity for flux greater than an affinity for the flux in other parts of the protective film 123. With this structure, adhesion of the flux in the recessed portion increases, thereby making it possible to efficiently prevent the flux from being excessively spread.

Figure 3:
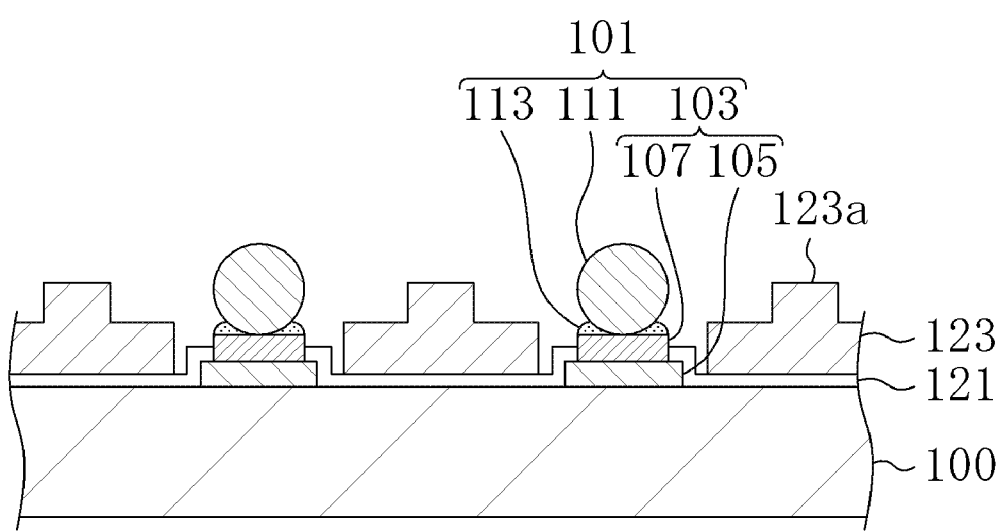
FIG. 3 is a cross-sectional view of a modified example of the semiconductor substrate structure according to the embodiment of the present invention.
Figure 4:
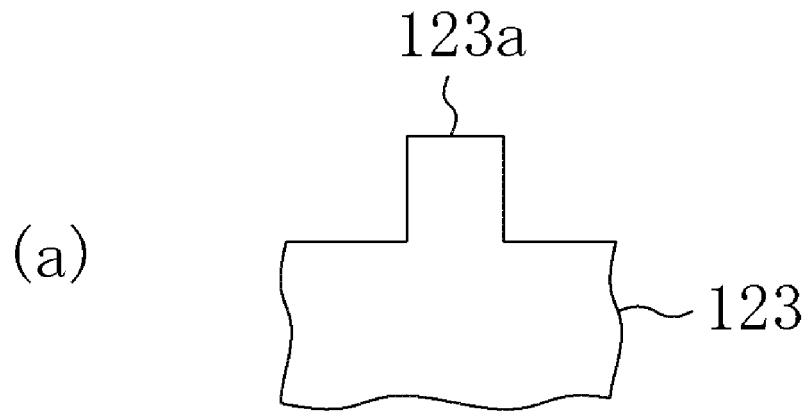
FIGS. 4A-4C are cross-sectional views showing shapes of raised portions in the modified example of the semiconductor substrate structure according to the embodiment of the present invention.
Figure 4:
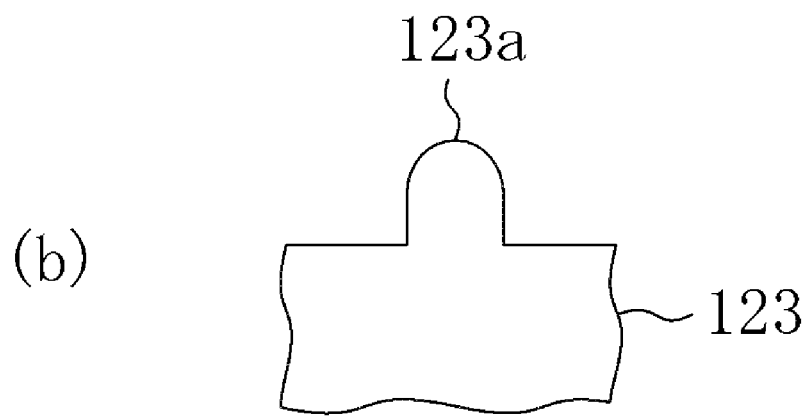
Figure 4:
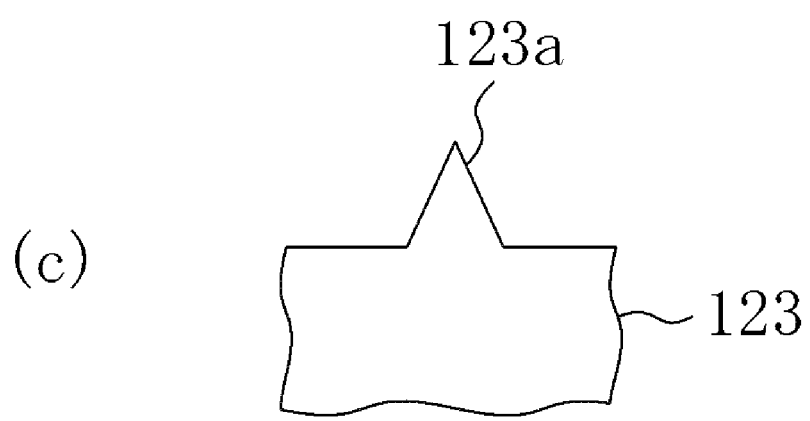

Instead of the recessed portion, the barrier portion 123a may be a raised portion as shown in FIG. 3. When the barrier portion 123a is the raised portion, excess flux is dammed up, thereby making it possible to reduce the excessive spread of the flux. With the raised portion, a region where the bump material moves is physically limited, thereby making it possible to reliably prevent the bump material from contacting adjacent bump materials. When the barrier portion 123a is the raised portion, it may be a raised portion having a flat upper surface as shown in FIG. 4A, may be a raised portion having a U-shaped cross section as shown in FIG. 4B, or may be a raised portion having an inverted V-shaped cross section as shown in FIG. 4C. Any shape other than these shapes may be used.

When the barrier portion 123a is the raised portion, it is preferable that at least a part of the raised portion has an affinity for flux less than an affinity for the flux in other parts of the protective film 123. With this structure, flux wettability in the recessed portion decreases, thereby making it possible to efficiently prevent the flux from being excessively spread.

Figure 5:
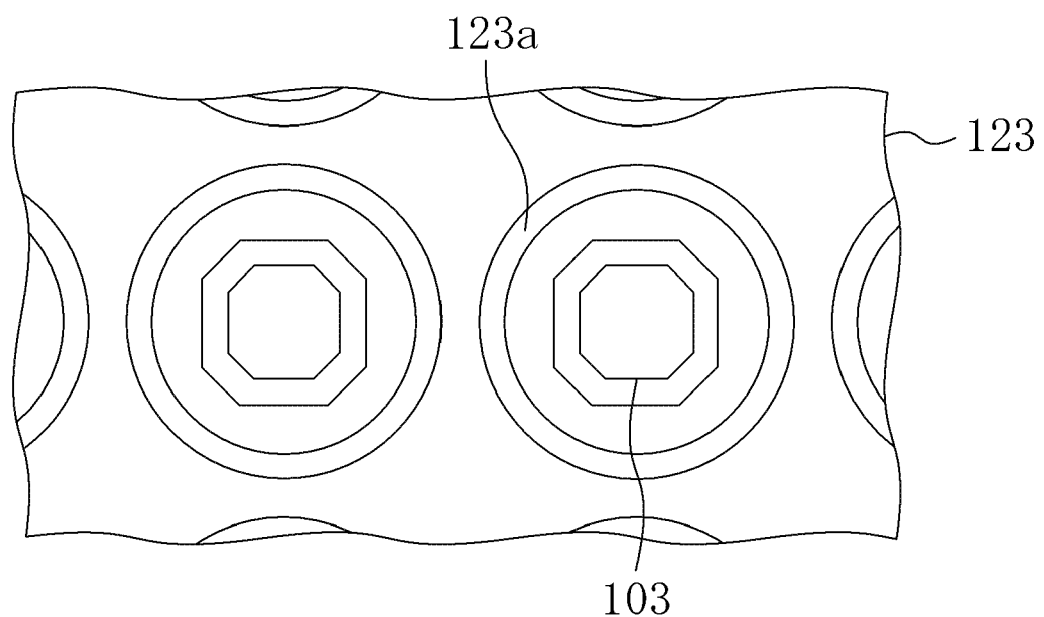
FIG. 5 is a plan view of a modified example of the semiconductor substrate structure according to the embodiment of the present invention.
Figure 6:
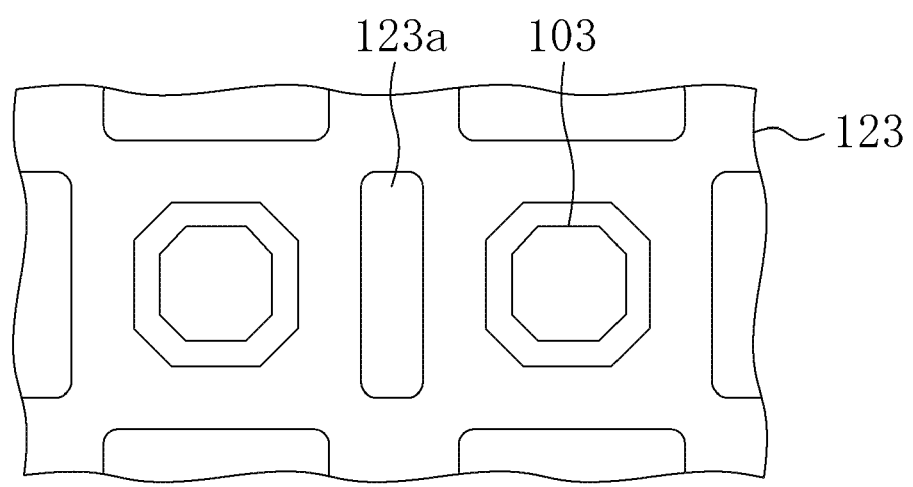
FIG. 6 is a plan view of a modified example of the semiconductor substrate structure according to the embodiment of the present invention.

The barrier portion 123a may be formed independently, as shown in FIG. 5. It may be formed in any shape, such as rectangular shape, hexagonal shape, circular shape, or the like when viewed in plan. The barrier portion 123a does not have to continuously surround the electrode pad 103, and may be divided into several independent parts, as shown in FIG. 6.

In the bump material mounting method, various types of fluxes are used, such as rosin-based flux, water soluble flux, etc. In particular, when halogen-free rosin-based flux is used, it contains a resin, a solvent, a thixo agent, an organic acid-based activator, and an amine-based additive, and contains, as a main component of the organic acid, a chemical agent having a carboxyl group as a functional group. Therefore, when the barrier portion 123a is the recessed portion, it is preferable that at least a part of the recessed portion is coated with a material which has a high affinity for the carboxyl group. With this structure, adhesion of flux in the at least a part of the recessed portion increases, thereby making it possible to further efficiently prevent the flux from being excessively spread. As the material having a high affinity for the carboxyl group, a high polarity polymer material or the like, such as polyethyleneimine, polyvinyl phenol or the like, may be used. Instead of the coating, the at least a part of the recessed portion may be formed by a material which has a high affinity for the flux, such as a high polarity polymer or the like.

On the contrary, when the barrier portion 123a is the raised portion, it is preferable that at least a part of the raised portion is coated with a material which has a low affinity for the carboxyl group. With this structure, flux wettability in the at least a part of the raised portion decreases, thereby making it possible to further efficiently prevent the flux from being excessively spread. As the material having a low affinity for the carboxyl group, a non-polar material represented by a fluorine-based material, for example, tetrafluoroethylene, etc., may be used. Instead of the coating, the at least a part of the raised portion may be formed by a non-polar material.

When a halogen-free rosin-based flux is used, the affinity of the barrier portion 123a for the carboxyl group may be controlled. When another flux is used, the affinity for the flux may be controlled according to the component included in the flux. In this case, when the barrier portion 123a is the recessed portion, an affinity of the barrier portion 123a for the flux may be increased, and when the barrier portion 123a is the raised portion, an affinity of the barrier portion 123a for the flux may be decreased.

The semiconductor substrate structure according to the present invention is useful as a semiconductor substrate structure having bumps, a semiconductor device (by using thereof) and the like, the semiconductor substrate structure capable of achieving a semiconductor device which solves a problem occurring during a flux printing to reduce occurrence of bump electrodes having defects.

What is claimed is:
1. A semiconductor substrate structure, comprising:
an electrode pad formed on a semiconductor substrate;

a protective film formed on the semiconductor substrate and having an opening through which the electrode pad is exposed; and a bump formed on the electrode pad, wherein the electrode pad and the protective film are formed with a distance from each other, the protective film has a barrier portion surrounding the electrode pad, the barrier portion has a height different from a height of a part of the protective film other than the barrier portion, the barrier portion is a recessed portion, and at least a part of the recessed portion has an affinity for flux higher than an affinity for the flux in parts of the protective film other than the part of the recessed portion.

2. The semiconductor substrate structure of claim 1, wherein the electrode pad has an electrode pad body and an under barrier metal layer formed on the electrode pad body, and a bottom surface of the recessed portion is located in a position equal to or higher than an upper surface of the electrode pad body.

3. The semiconductor substrate structure of claim 1, wherein the barrier portion continuously surrounds the electrode pad.

4. The semiconductor substrate structure of claim 1, wherein the protective film is made of a polyimide resin, a polybenzoxazole resin, or a silicone-based resin.

5. A semiconductor device, comprising the semiconductor substrate structure of claim 1.

6. A semiconductor substrate structure, comprising:

an electrode pad formed on a semiconductor substrate;

a protective film formed on the semiconductor substrate and having an opening through which the electrode pad is exposed; and a bump formed on the electrode pad, wherein the electrode pad and the protective film are formed with a distance from each other, the protective film has a barrier portion surrounding the electrode pad, the barrier portion has a height different from a height of a part of the protective film other than the barrier portion, the barrier portion is a raised portion, and at least a part of the raised portion has an affinity for flux lower than an affinity for the flux in parts of the protective film other than the part of the raised portion.

7. The semiconductor substrate structure of claim 6, wherein the barrier portion continuously surrounds the electrode pad.

8. The semiconductor substrate structure of claim 6, wherein the protective film is made of a polyimide resin, a polybenzoxazole resin, or a silicone-based resin.

9. A semiconductor device, comprising the semiconductor substrate structure of claim 6.

* * * * *

UNITED STATES PATENT AND TRADEMARK OFFICE
CERTIFICATE OF CORRECTION

PATENT NO. : 8,378,505 B2
APPLICATION NO. : 13/189097
DATED : February 19, 2013
INVENTOR(S) : Sumiaki Nakano Page 1 of 1

It is certified that error appears in the above-identified patent and that said Letters Patent is hereby corrected as shown below:

Title Page In (56) References Cited:

U.S. PATENT DOCUMENTS
INSERT

--2005/0151269 A1   07/2005   Song et al.--.

Signed and Sealed this
Second Day of September, 2014

Michelle K. Lee
*Deputy Director of the United States Patent and Trademark Office*